United States Patent
Lo et al.

(10) Patent No.: US 6,906,917 B2
(45) Date of Patent: Jun. 14, 2005

(54) WEB PAD MODULE WITH COUPLING DEVICES INSTALLED ON A REAR SIDE OF A WEB PAD

(75) Inventors: Chia-Ching Lo, Taipei Hsien (TW); Chia-Lin Chang, Taipei (TW); Chyi-Yong Sy, Taipei Hsien (TW)

(73) Assignee: AboCom Systems, Inc., Hsin-Chu (TW)

( * ) Notice: Subject to any disclaimer, the term of this patent is extended or adjusted under 35 U.S.C. 154(b) by 462 days.

(21) Appl. No.: 10/063,209

(22) Filed: Mar. 28, 2002

(65) Prior Publication Data

US 2002/0186546 A1 Dec. 12, 2002

(30) Foreign Application Priority Data

Jun. 7, 2001 (TW) ........................................ 90113881 A

(51) Int. Cl.[7] ................................................ H05K 7/00
(52) U.S. Cl. ........................ 361/686; 361/728; 361/681; 361/682; 174/138 G
(58) Field of Search .................................. 361/683–687, 361/801, 728–730, 752, 807–810, 681, 682; 174/138 G

(56) References Cited

U.S. PATENT DOCUMENTS

| 5,710,728 | A | 1/1998 | Danielson et al. |
| 6,231,371 | B1 | 5/2001 | Helot et al. |
| 6,283,777 | B1 * | 9/2001 | Canova et al. .............. 439/218 |
| 6,301,106 | B1 * | 10/2001 | Helot et al. ................. 361/686 |
| 6,483,698 | B1 * | 11/2002 | Loh ............................ 361/686 |
| 6,519,144 | B1 * | 2/2003 | Henrie et al. ............... 361/686 |
| 6,545,862 | B1 * | 4/2003 | Gettemy et al. ............ 361/683 |
| 6,556,435 | B1 | 4/2003 | Helot et al. |

FOREIGN PATENT DOCUMENTS

| JP | 11-003139 | 1/1999 |
| JP | 11-053052 | 2/1999 |
| JP | 11-212671 | 8/1999 |
| JP | 2001-034364 | 2/2001 |
| WO | WO 02/03181 A2 | 1/2002 |
| WO | WO 02/21248 A1 | 3/2002 |

* cited by examiner

Primary Examiner—Randy W. Gibson
Assistant Examiner—Jeremy Norris
(74) Attorney, Agent, or Firm—Winston Hsu

(57) ABSTRACT

A web pad module has a portable web pad and a pedestal. The portable web pad has a housing including a front side and a rear side, a processing circuit installed inside the housing, a display panel installed on the front side of the housing, and a first coupling device installed on the rear side of the housing that has a first connector electrically connected to the processing circuit. The pedestal has a second coupling device detachably coupling with the first coupling device. The second coupling device includes a second connector corresponding to the first connector. When the first coupling device is coupled with the second coupling device, the first connector is connected to the second connector so as to transmit signals between the portable web pad and a peripheral device through the pedestal.

17 Claims, 6 Drawing Sheets

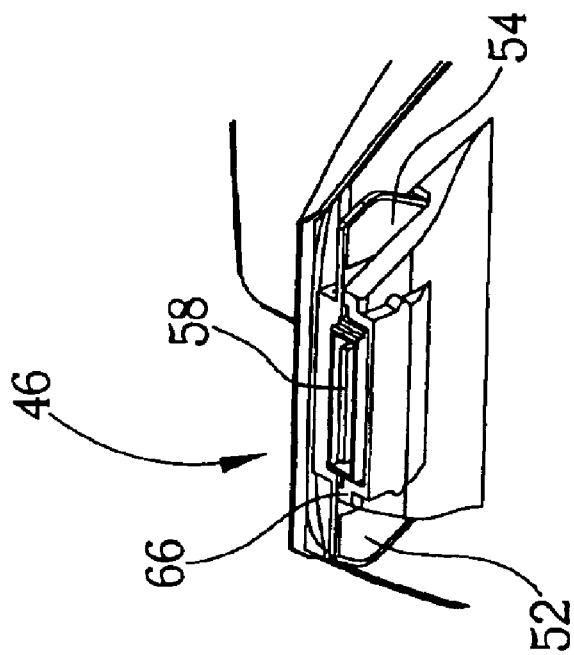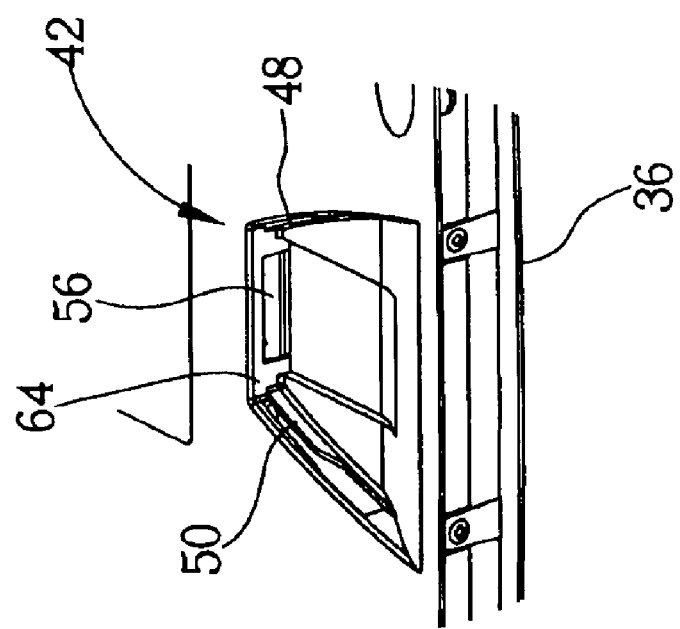
Fig. 4

WEB PAD MODULE WITH COUPLING DEVICES INSTALLED ON A REAR SIDE OF A WEB PAD

BACKGROUND OF INVENTION

1. Field of the Invention

The invention relates to a web pad module, and more particularly, to a web pad module with coupling devices installed on a rear side of a web pad.

2. Description of the Prior Art

A web pad is a simplified portable computer that helps a user to connect to the Internet anywhere and anytime. Generally, the web pad is designed to have a flat shape and be pocket sized for portability. With the prevalence of the Internet, the web pad has gained substantial interest as the best solution for acquiring data from the Internet whenever needed.

Please refer to FIG. 1. FIG. 1 is a perspective view of a prior art web pad module 10. The prior art web pad module 10 comprises a portable web pad 12 and a pedestal 14. The portable web pad 12 includes a housing 16, a display panel 18 for displaying images, and a first coupling device 20 installed on a bottom of the housing 16 for providing electrical and mechanical connections between the portable web pad 12 and the pedestal 14. The pedestal 14 has a second coupling device 22 for coupling with the first coupling device 20. The portable web pad 12 further has a battery installed inside the housing 16 for supplying power. When a user desires to use the portable web pad 12 on a table, the portable web pad 12 can be placed onto the pedestal 14 for convenient use.

Nevertheless, several disadvantages arise with the prior art web pad module 10. First, since the battery is installed inside the housing 16, when the battery is run down, it is not replaced easily and quickly with another new battery.

Additionally, the possibility of utilizing various kinds of batteries is restricted as well. Furthermore, since the first, and the second coupling devices 20, 22 are respectively disposed on the portable web pad 12 and the pedestal 14, the placement of the battery on the bottom of the housing 16 causes difficulties in the arrangement and fabrication of the relevant elements and mechanisms.

SUMMARY OF INVENTION

It is therefore a primary objective of the claimed invention to provide a web pad module with coupling devices installed on a rear side of a web pad to solve the above-mentioned problem.

According to the claimed invention, the web pad module comprises a portable web pad and a pedestal. The portable web pad has a housing including a front side and a rear side, a processing circuit installed inside the housing for controlling the portable web pad, a display panel installed on the front side of the housing for displaying images, and a first coupling device installed on the rear side of the housing and having a first connector electrically connected to the processing circuit. The pedestal has a second coupling device detachably coupling with the first coupling device so as to place the portable web pad onto the pedestal. The second coupling device includes a second connector corresponding to the first connector. When the first coupling device is coupled with the second coupling device, the first connector is connected to the second connector so as to transmit signals between the portable web pad and a peripheral device through the pedestal.

It is an advantage of the claimed invention that the wed pad module with the coupling devices installed on the rear side of the web pad has a simpler structure, a simple fabrication, and a convenient use to overcome the prior art shortcomings.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 4 is a schematic diagram of first and second coupling devices shown in FIGS. 2 and 3.

DETAILED DESCRIPTION

Figure 1:
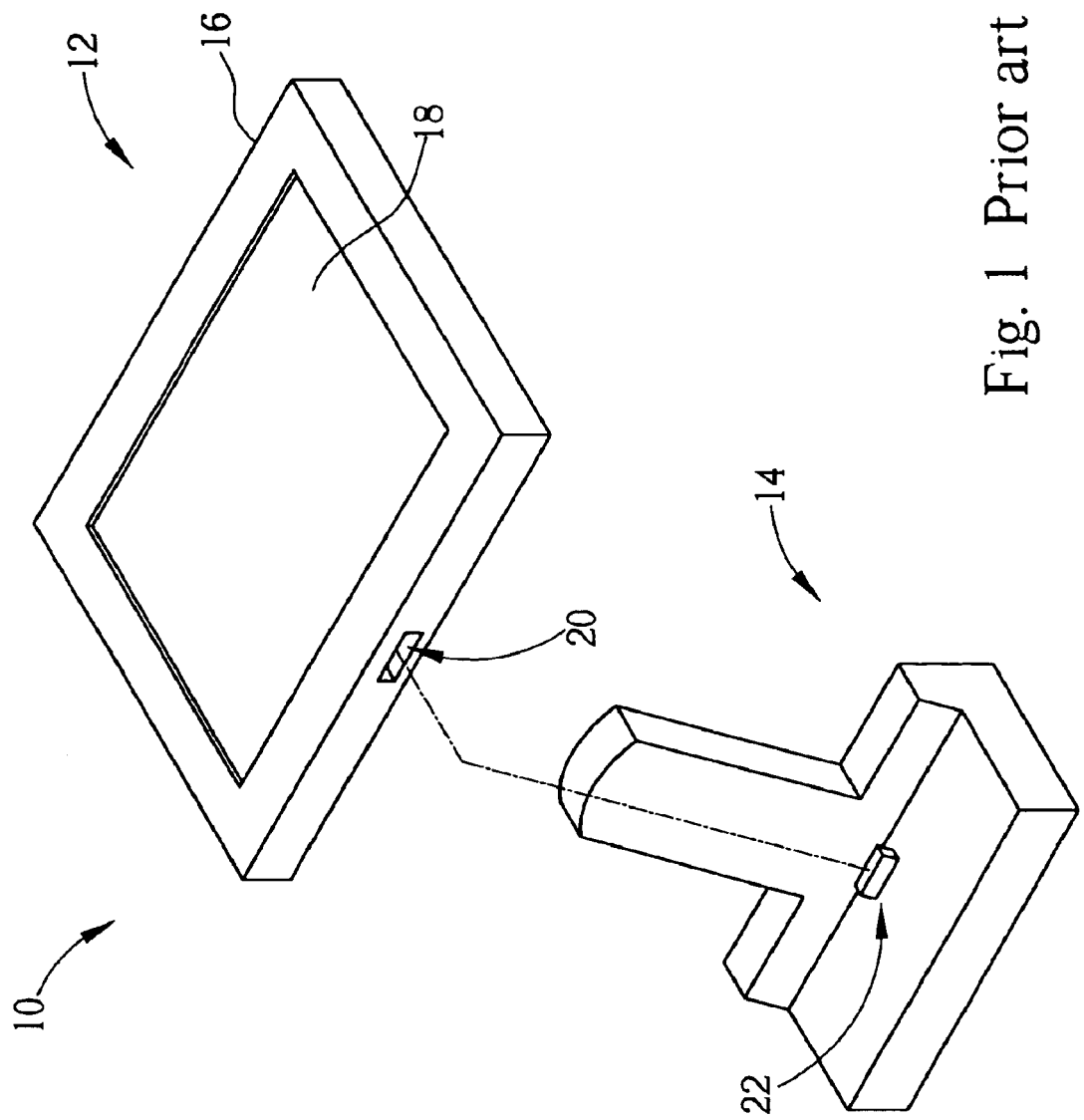
FIG. 1 is a perspective view of a prior art web pad module.
Figure 2:
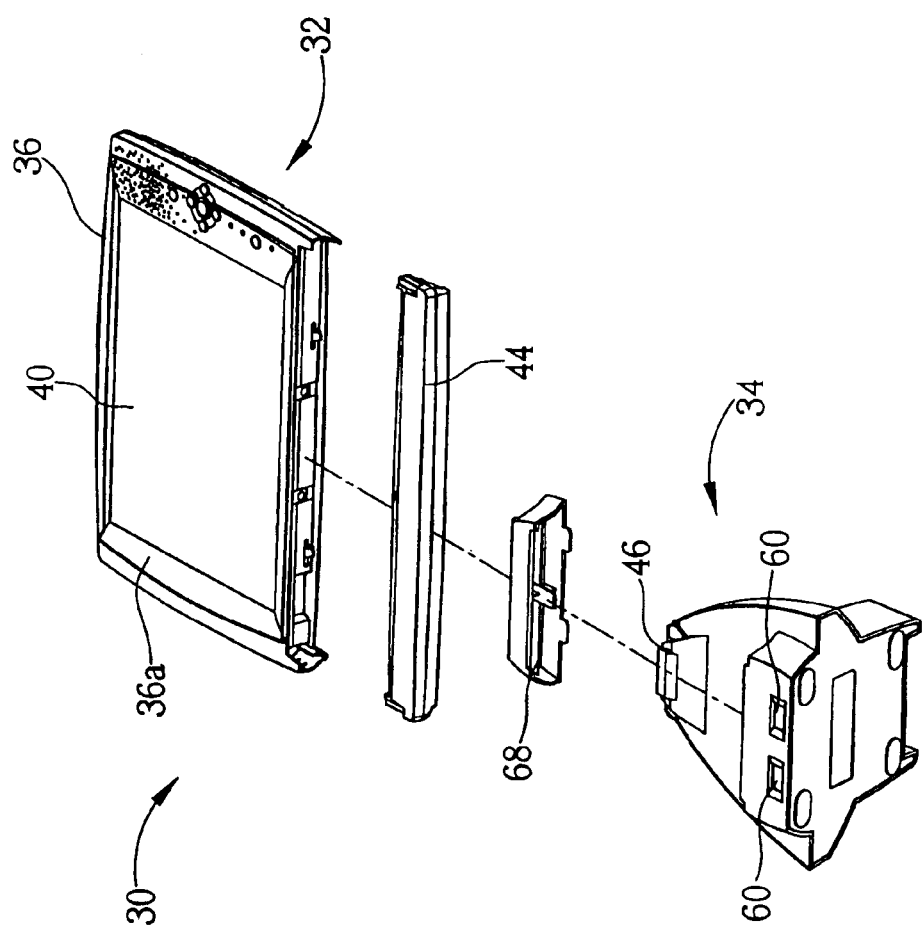
FIG. 2 is a front view of a web pad module according to the present invention.
Figure 3:
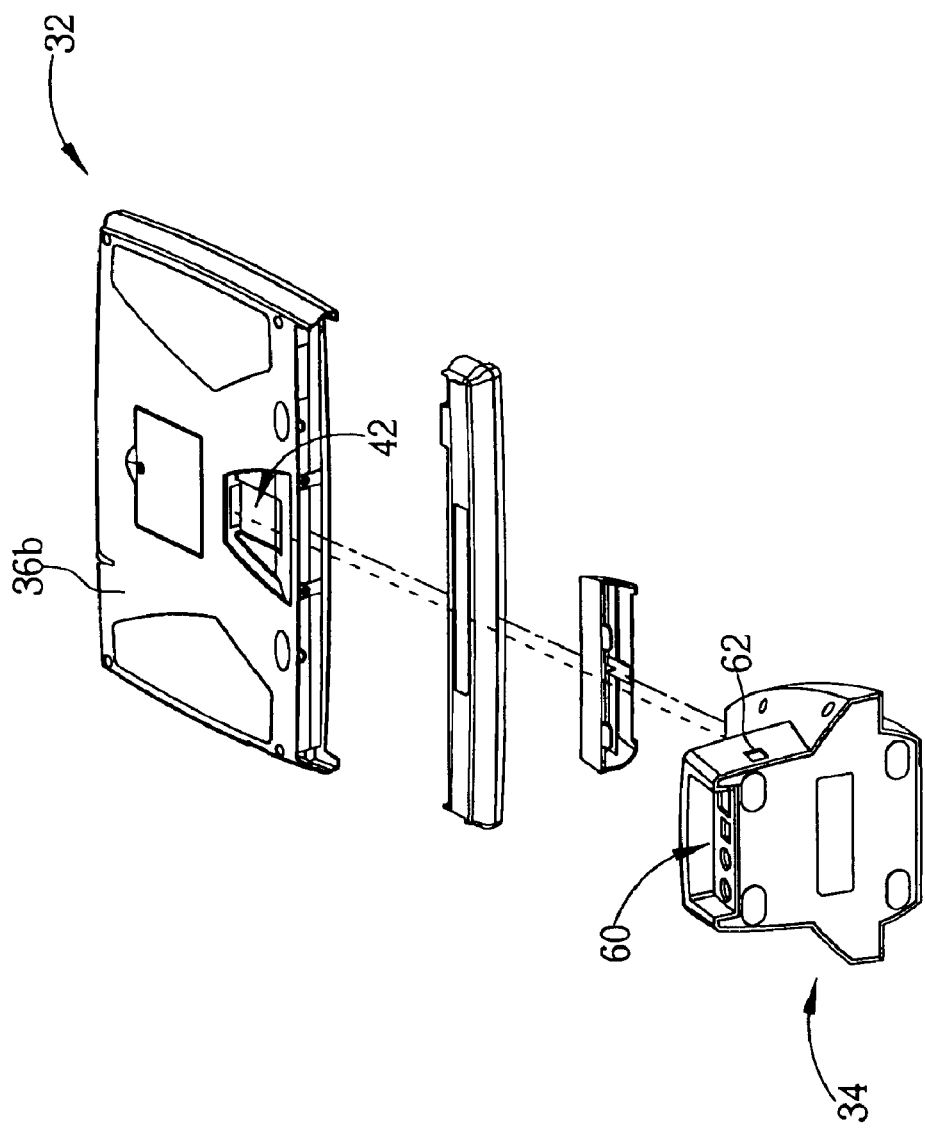
FIG. 3 is a rear view of the web pad module shown in FIG. 2.

Please refer to FIGS. 2 and 3. FIG. 2 is a front view of a web pad module 30 according to the present invention. FIG. 3 is a rear view of the web pad module 30 shown in FIG. 2. The web pad module 30 comprises a portable web pad 32 and a pedestal 34. The portable web pad 32 can be placed on the pedestal 34.

As shown in FIGS. 2 and 3, the portable web pad 32 comprises a housing 36, a display panel 40 for displaying images, a first coupling device 42 (please refer to FIG. 3), and a first battery 44 installed on a bottom of the housing 36 in a replaceable manner for supplying power. The housing 36 includes a front side 36a and a rear side 36b (see FIG. 3). The display panel 40 is installed on the front side 36a of the housing 36, and the first coupling device 42 is installed on the rear side 36b of the housing 36. The pedestal 34 has a second coupling device 46 used for coupling with the first coupling device 42, thereby placing the portable web pad 32 onto the pedestal 34.

Additionally, the pedestal 34 further comprises a plurality of expanding ports 60 installed on the pedestal 34 for allowing electrical connection to corresponding expanding devices. The expanding ports 60 may be interfaces such as a Universal Serial Bus (USB), a Personal System 2 (PS2), and a mini Video Graphics Array (VGA). The pedestal 34 further has a power port 62 installed on the pedestal 34 for being electrically connected to a power supply so as to supply power.

Please refer to FIG. 4. FIG. 4 is a schematic diagram of the first and the second coupling devices 42, 46 shown in FIGS. 2 and 3. The first coupling device 42 is a socket, which is cut out of the rear side 36b of the housing 36 in a concave manner, such that the first coupling device 42 has one shallow end and one deep end. The second coupling device 46 is a protrusion capable of being inserted into the first coupling device 42 so as to place the portable web pad 32 onto the pedestal 34. The first coupling device 42 comprises two sliding slots 48, 50 installed on two sides of the first coupling device 42, and the second coupling device 46 comprises two corresponding protrusions 52, 54 for clamping with the two sliding slots 48, 50.

As shown in FIG. 4, the first coupling device 42 has a first connector 56, and the second coupling device 46 has a second connector 58 corresponding to the first connector 56. The first connector 56 is installed on a first upper side 64 of the first coupling device 42, and the second connector 58 is installed on a second upper side 66 of the second coupling device 46 corresponding to the first upper side 64. Through this design, the first coupling device 42 of the portable web pad 32 can be inserted downward to the second coupling device 46 on the pedestal 34 so as to connect the first connector 56 to the second connector 58.

Figure 5:
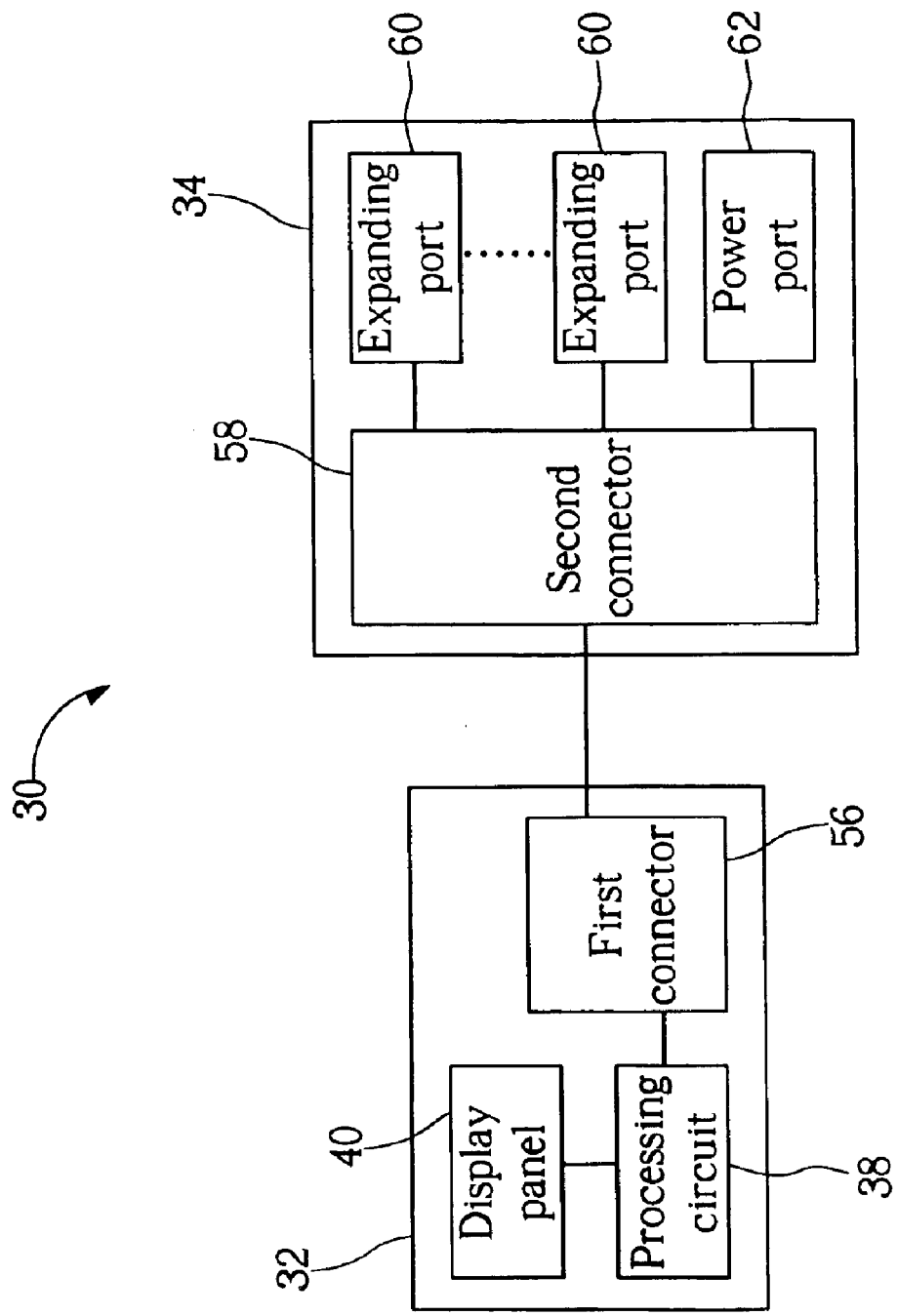
FIG. 5 is a function block diagram of the web pad module shown in FIG. 2.

Please refer to FIG. 5. FIG. 5 is a function block diagram of the web pad module 30 shown in FIG. 2. The portable web pad 30 further comprises a processing circuit 38 installed inside the housing 36 for controlling the portable web pad 32.

Both the display panel 40 and the first connector 56 of the portable web pad 32 are electrically connected to the processing circuit 38. Likewise, both of the expanding ports 60 and the power port 62 of the pedestal 34 are electrically connected to the second connector 58. When the first coupling device 42 clamps the second coupling device 46, the first connector 56 is connected to the second connector 58 so as to transmit signals between the portable web pad 32 and a peripheral device through the pedestal 34.

Figure 7:
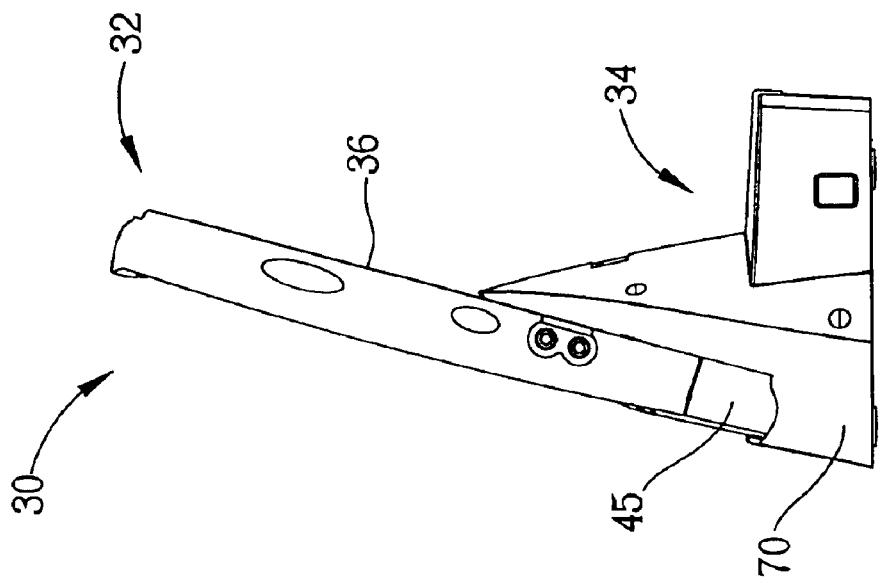
FIG. 7 is an alternative side view of the web pad module shown in FIG. 2 when assembled.
Figure 6:
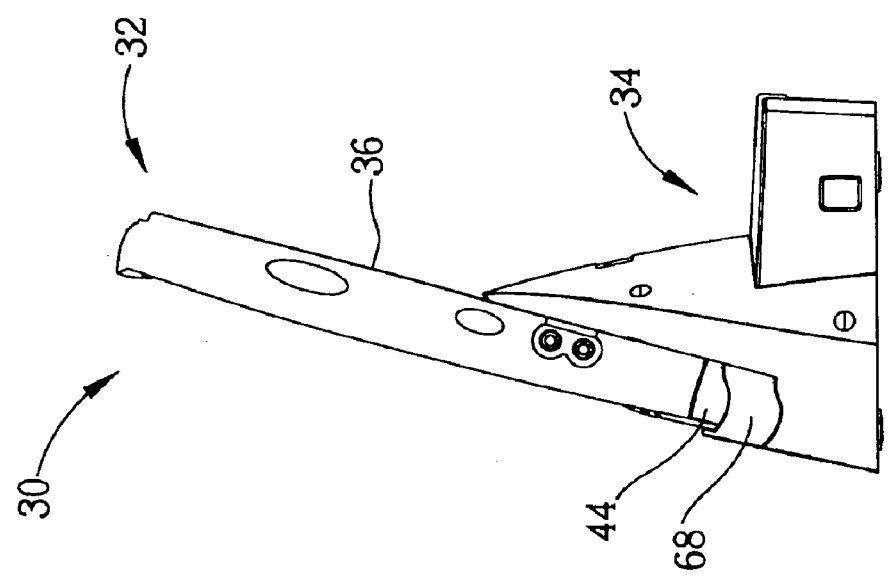
FIG. 6 is a side view of the web pad module shown in FIG. 2 when assembled.

Please refer to FIGS. 6 and 7. FIG. 6 is a side view of the web pad module 30 shown in FIG. 2 when assembled. FIG. 7 is an alternative side view of the web pad module 30 shown in FIG. 2 when assembled. As described previously, the portable web pad 32 comprises the first battery 44 installed on the bottom of the housing 36 in a replaceable manner for supplying power. In a preferred embodiment of the present invention, as shown in FIGS. 2 and 6, the pedestal 34 further comprises a first support 68 detachably installed on the pedestal 34. As shown in FIG. 6, when the first coupling device 42 clamps with the second coupling device 46, the first support 68 is against a bottom of the first battery 44 so as to support the portable web pad 32.

As shown in FIG. 7, when the first battery 44 is replaced by a second battery 45 with a longer length, the pedestal 34 is against a bottom of the second battery 45 at a contact portion 70 so as to support the portable web pad 34. Therefore, with this design, the portable web pad 32 can be firmly placed on the pedestal 34 no matter what kinds of batteries are used.

Surely, when the first battery 44 is replaced by a battery that has a length between the lengths of the first and the second batteries 44, 45, the first support 68 can also be replaced by a second support with a lower height. At this time, the second support is against a bottom of the battery so as to support the portable web pad 32.

In contrast to the prior art, the web pad module according to the present invention adopts a design in which the coupling devices of the portable web pad and the pedestal are installed on the rear side of the portable web pad. In addition, the pedestal also has a detachable support. Consequently, the web pad module according to the present invention has the advantages of simple structure, easy fabrication, and convenient use. Moreover, when different kinds of batteries are utilized in the portable web pad, the portable web pad can be firmly placed on the pedestal for convenient use.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A web pad module comprising:
   a portable web pad having:
   a housing including a front side and a rear side;
   a processing circuit installed inside the housing for controlling the portable web pad;
   a display panel installed on the front side of the housing for displaying images; and
   a first coupling device installed on the rear side of the housing and having a first connector electrically connected to the processing circuit;
   a first battery installed on a bottom of the housing in a replaceable manner for supplying power;
   a pedestal having a second coupling device detachably coupling with the first coupling device so as to place the portable web pad onto the pedestal, the second coupling device comprising a second connector corresponding to the first connector; and
   a first support detachably installed on the pedestal, wherein when the first coupling device clamps with the second coupling device, the first support presses against a bottom of the first battery so as to support the portable web pad;
   wherein when the first coupling device is coupled with the second coupling device, the first connector is connected to the second connector so as to transmit signals between the portable web pad and a peripheral device through the pedestal.

2. The web pad module of claim 1 wherein the first coupling device is a socket and the second coupling device is a protrusion, the second coupling device is capable of being inserted into the first coupling device so as to place the portable web pad onto the pedestal.

3. The web pad module of claim 2 wherein the first coupling device is cut out of the rear side of the housing in a concave manner with the first coupling device having one shallow end and one deep end.

4. The web pad module of claim 2 wherein the first coupling device comprises two sliding slots installed on two sides of the first coupling device, and the second coupling device comprises two corresponding protrusions for clamping with the two sliding slots.

5. The web pad module of claim 1 wherein the pedestal further comprises at least one expanding port installed on the pedestal, the expanding port being electrically connected to the second connector for connecting an expanding device.

6. The web pad module of claim 1 wherein the pedestal further comprises at least one power port installed on the pedestal and electrically connected to the second connector for connecting a power supply so as to supply power.

7. The web pad module of claim 1 wherein when the first battery is replaced by a second battery, the pedestal is against a bottom of the second battery so as to support the portable web pad.

8. The web pad module of claim 1 wherein the first support is installed on the pedestal in a replaceable manner, when the first battery is replaced by a second battery, the first support is capable of being replaced by a second support, the second support is against a bottom of the second battery so as to support the portable web pad.

9. A web pad module comprising:
   a portable web pad having:
   a housing including a front side and a rear side;

a processing circuit installed inside the housing for controlling the portable web pad;

a display panel installed on the front side of the housing for displaying images;

a first coupling device installed on the rear side of the housing; and a first battery installed on a bottom of the housing in a replaceable manner for supplying power; and a pedestal having a second coupling device used for coupling with the first coupling device, and a first support detachably installed on the pedestal for being against a bottom of the first battery so as to support the portable web pad;

wherein when the first battery is replaced by a second battery, the first support is removed so that the pedestal is capable of supporting the portable web pad.

10. The web pad module of claim 9 wherein the first coupling device has a first connector electrically connected to the processing circuit and the second coupling device has a second connector corresponding to the first connector, when the first coupling device clamps the second coupling device, the first connector is connected to the second connector so as to transmit signals between the portable web pad and a peripheral device through the pedestal.

11. The web pad module of claim 9 wherein the first coupling device is a socket and the second coupling device is a protrusion, the second coupling device is capable of being inserted into the first coupling device so as to place the portable web pad onto the pedestal.

12. The web pad module of claim 11 wherein the first coupling device is cut out of the rear side of the housing in a concave manner with the first coupling device having one shallow end and one deep end.

13. The web pad module of claim 11 wherein the first coupling device comprises two sliding slots installed on two sides of the first coupling device, and the second coupling device comprises two corresponding protrusions for clamping with the two sliding slots.

14. The web pad module of claim 9 wherein when the first battery is replaced by a second battery, the first support is replaced by a second support and the second support is against a bottom of the second battery so as to support the portable web pad.

15. A web pad module comprising:

a portable web pad having:

a housing including a front side and a rear side;

a processing circuit installed inside the housing for controlling the portable web pad;

a display panel installed on the front side of the housing for displaying images;

a first connector installed on the rear side of the housing and electrically connected to the processing circuit; and a first battery installed on a bottom of the housing in a replaceable manner for supplying power; and a pedestal having a second connector corresponding to the first connector used for coupling with the first connector so as to transmit signals between the portable web pad and a peripheral device through the pedestal, and a first support detachably installed on the pedestal for being against a bottom of the first battery so as to support the portable web pad;

wherein when the first battery is replaced by a second battery, the first support is removed so that the pedestal is capable of supporting the portable web pad.

16. The web pad module of claim 15 wherein the portable web pad further comprises a first coupling device installed on the rear side of the housing and having the first connector, the pedestal further comprises a second coupling device used for coupling with the first coupling device and having the second connector, when the first coupling device clamps with the second coupling device, the first connector is connected to the second connector.

17. The web pad module of claim 15 wherein when the first battery is replaced by a second battery, the first support is replaced by a second support and the second support is against a bottom of the second battery so as to support the portable web pad.

* * * * *